United States Patent
Chow et al.

(10) Patent No.: US 9,171,769 B2
(45) Date of Patent: Oct. 27, 2015

(54) SEMICONDUCTOR DEVICE AND METHOD OF FORMING OPENINGS THROUGH ENCAPSULANT TO REDUCE WARPAGE AND STRESS ON SEMICONDUCTOR PACKAGE

(75) Inventors: Seng Guan Chow, Singapore (SG); Lee Sun Lim, Singapore (SG); Rui Huang, Singapore (SG); Xusheng Bao, Singapore (SG); Ma Phoo Pwint Hlaing, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 823 days.

(21) Appl. No.: 12/961,260

(22) Filed: Dec. 6, 2010

(65) Prior Publication Data

US 2012/0139120 A1 Jun. 7, 2012

(51) Int. Cl.
*H01L 23/31* (2006.01)
*H01L 21/56* (2006.01)
*H01L 23/00* (2006.01)

(52) U.S. Cl.
CPC .......... *H01L 23/3121* (2013.01); *H01L 21/561* (2013.01); *H01L 23/3128* (2013.01); *H01L 24/19* (2013.01); *H01L 24/96* (2013.01); *H01L 2224/12105* (2013.01); *H01L 2224/24137* (2013.01); *H01L 2924/00013* (2013.01); *H01L 2924/01029* (2013.01); *H01L 2924/01322* (2013.01); *H01L 2924/12041* (2013.01); *H01L 2924/1306* (2013.01); *H01L 2924/13091* (2013.01); *H01L 2924/1815* (2013.01); *H01L 2924/18162* (2013.01)

(58) Field of Classification Search
CPC ....................................................... H01L 23/315
See application file for complete search history.

(56) References Cited

U.S. PATENT DOCUMENTS

| 5,155,579 | A | * | 10/1992 | AuYeung | 257/722 |
| 5,371,404 | A | * | 12/1994 | Juskey et al. | 257/659 |
| 7,489,044 | B2 | * | 2/2009 | Pu et al. | 257/787 |
| 7,666,716 | B2 | * | 2/2010 | Pu et al. | 438/126 |
| 7,675,152 | B2 | | 3/2010 | Gerber et al. | |
| 7,875,894 | B2 | * | 1/2011 | Yamaguchi | 257/95 |
| 7,944,034 | B2 | * | 5/2011 | Gerber et al. | 257/686 |
| 7,977,228 | B2 | * | 7/2011 | Ramachandrarao | 438/597 |
| 7,977,229 | B2 | * | 7/2011 | Ohuchi et al. | 438/598 |
| 8,183,677 | B2 | * | 5/2012 | Meyer-Berg | 257/686 |
| 8,354,302 | B2 | * | 1/2013 | Yamaguchi | 438/113 |
| 2002/0096789 | A1 | * | 7/2002 | Bolken | 257/787 |
| 2005/0012227 | A1 | * | 1/2005 | Bolken | 257/787 |
| 2005/0133913 | A1 | | 6/2005 | Okamoto | |
| 2007/0148918 | A1 | * | 6/2007 | Kinsman et al. | 438/460 |

(Continued)

*Primary Examiner* — Stephen W Smoot
(74) *Attorney, Agent, or Firm* — Robert D. Atkins; Atkins and Associates, P.C.

(57) ABSTRACT

A semiconductor device has a plurality of semiconductor die mounted active surface to a carrier. An encapsulant is deposited over semiconductor die and carrier. Openings are formed through a surface of the encapsulant to divide the encapsulant into discontinuous segments. The openings have straight or beveled sidewalls. The openings can be formed partially through the surface of the encapsulant in an area between the semiconductor die. The openings can be formed partially through the surface of the encapsulant over the semiconductor die. The openings can be formed through the encapsulant in an area between the semiconductor die. A portion of the surface of the encapsulant is removed down to a bottom of the openings. The carrier is removed. An interconnect structure is formed over the encapsulant and the semiconductor die. The encapsulant is cured prior to or after forming the openings.

21 Claims, 10 Drawing Sheets

(56) References Cited

U.S. PATENT DOCUMENTS

| | | |
|---|---|---|
| 2008/0003718 A1 | 1/2008 | Estepa et al. |
| 2008/0265383 A1* | 10/2008 | Brunnbauer et al. ......... 257/659 |
| 2008/0315385 A1* | 12/2008 | Gerber et al. ................. 257/686 |
| 2010/0072600 A1* | 3/2010 | Gerber .......................... 257/686 |
| 2011/0233747 A1 | 9/2011 | Lee et al. |
| 2012/0032340 A1* | 2/2012 | Choi et al. .................... 257/774 |

* cited by examiner

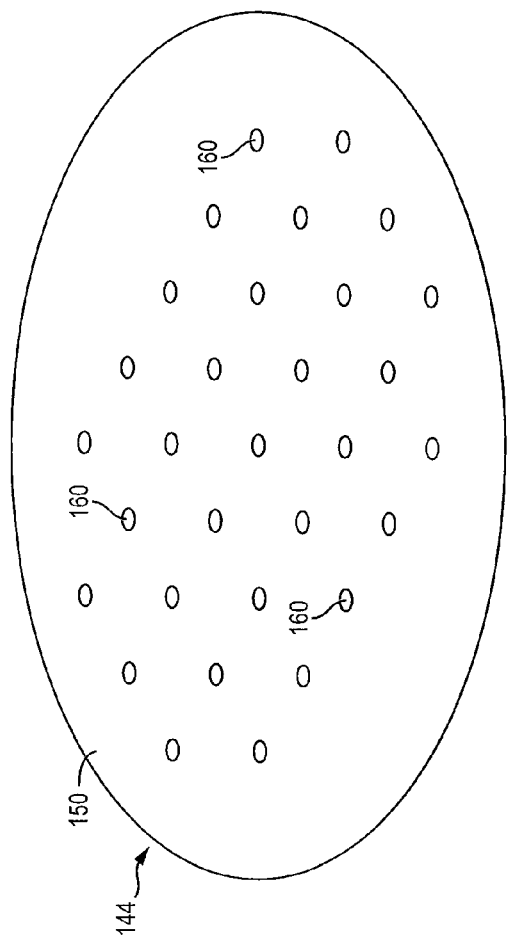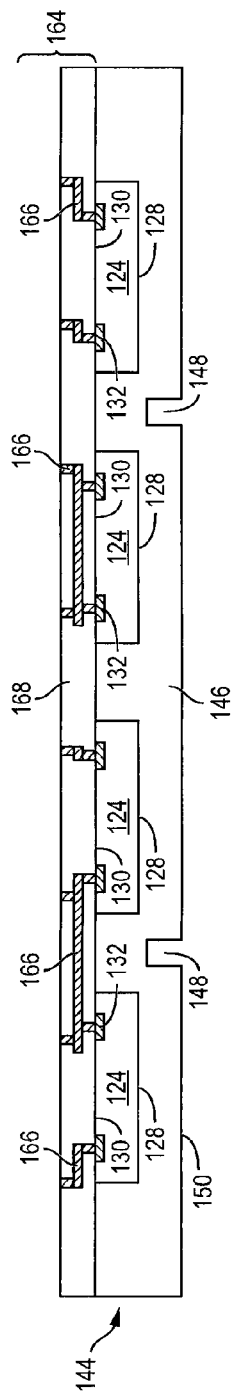
FIG. 4j
FIG. 4k

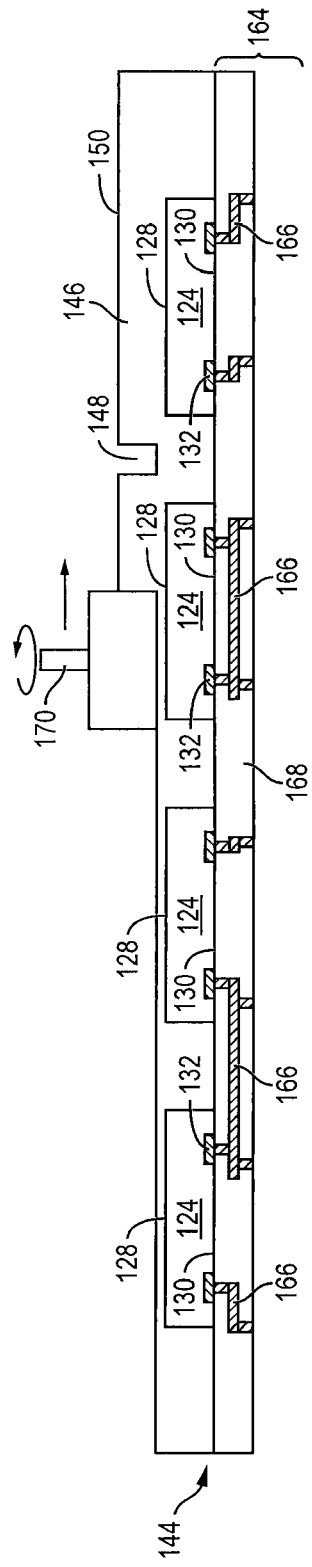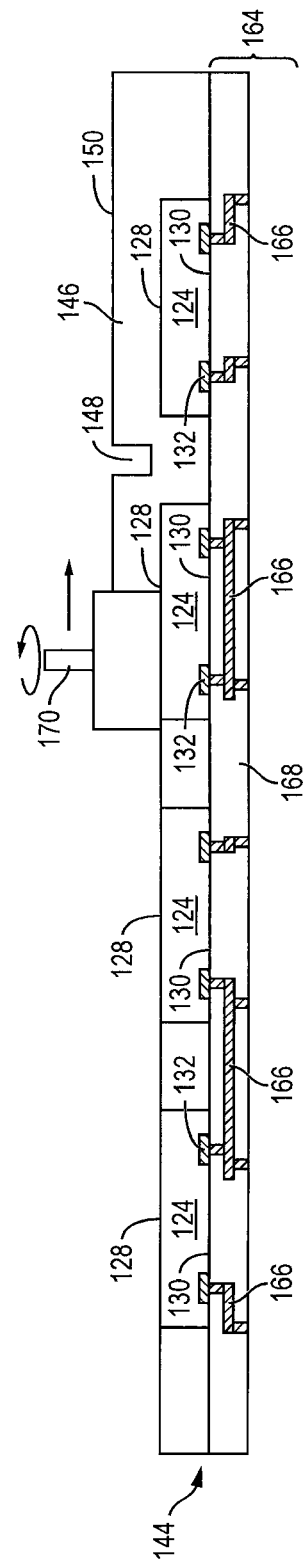

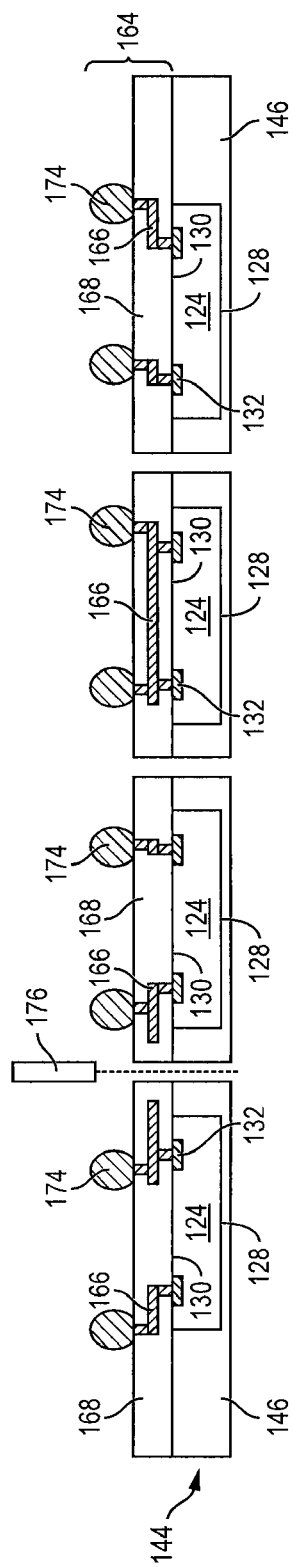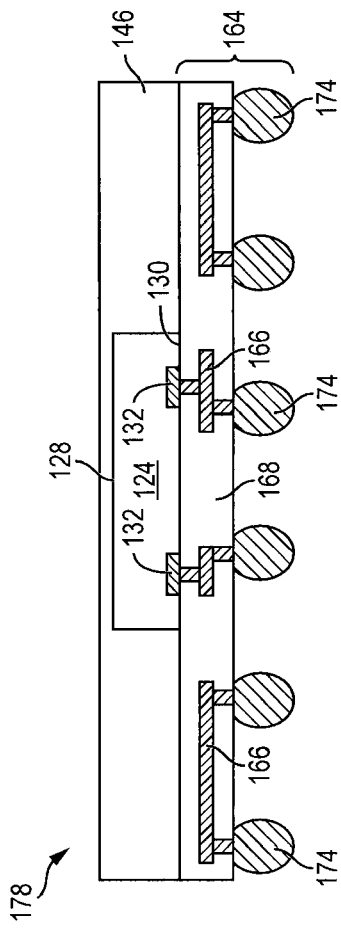

SEMICONDUCTOR DEVICE AND METHOD OF FORMING OPENINGS THROUGH ENCAPSULANT TO REDUCE WARPAGE AND STRESS ON SEMICONDUCTOR PACKAGE

FIELD OF THE INVENTION

The present invention relates in general to semiconductor devices and, more particularly, to a semiconductor device and method of forming openings through an encapsulant of a reconfigured wafer to reduce warpage and stress on a semiconductor package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a fan-out wafer level chip scale package (Fo-WLCSP), a plurality of semiconductor die is mounted to a carrier and covered by encapsulant to constitute a reconfigured wafer. The carrier is removed and a build-up interconnect structure is formed over the semiconductor die and encapsulant. The semiconductor die and encapsulant are singulated through the encapsulant to provide the Fo-WLCSP. The reconfigured wafer tends to warp after depositing and compressing the encapsulant. The degree of warpage increases with a larger reconfigured wafer. The wafer warpage leads to subsequent manufacturing problems, such as an out-of-focus condition during photolithography.

SUMMARY OF THE INVENTION

A need exists to reduce warpage and control coplanarity of reconfigured wafers. Accordingly, in one embodiment, the present invention is a method of making a semiconductor device comprising the steps of providing a carrier, providing a plurality of semiconductor die, mounting the semiconductor die to the carrier, depositing an encapsulant over the semiconductor die and carrier, forming channels partially through a surface of the encapsulant to divide the encapsulant into discontinuous segments, removing the carrier, forming an interconnect structure over the encapsulant and semiconductor die, and removing a portion of the surface of the encapsulant down to the channels.

In another embodiment, the present invention is a method of making a semiconductor device comprising the steps of providing a carrier, mounting a plurality of semiconductor die to the carrier, depositing an encapsulant over the semiconductor die and carrier, forming openings through a surface of the encapsulant to divide the encapsulant into discontinuous segments, removing the carrier, and forming an interconnect structure over the encapsulant and semiconductor die.

In another embodiment, the present invention is a method of making a semiconductor device comprising the steps of providing a plurality of semiconductor die, depositing an encapsulant over the semiconductor die, forming openings through a surface of the encapsulant to divide the encapsulant into discontinuous segments, and forming an interconnect structure over the encapsulant and semiconductor die.

In another embodiment, the present invention is a semiconductor device comprising a semiconductor die and encapsulant deposited over the semiconductor die. Openings are formed through a surface of the encapsulant to divide the encapsulant into discontinuous segments. An interconnect structure is formed over the encapsulant and semiconductor die.

BRIEF DESCRIPTION OF THE DRAWINGS

FIG. 5 illustrates the semiconductor package after singulation of the reconfigured wafer.

DETAILED DESCRIPTION OF THE DRAWINGS

Figure 1:
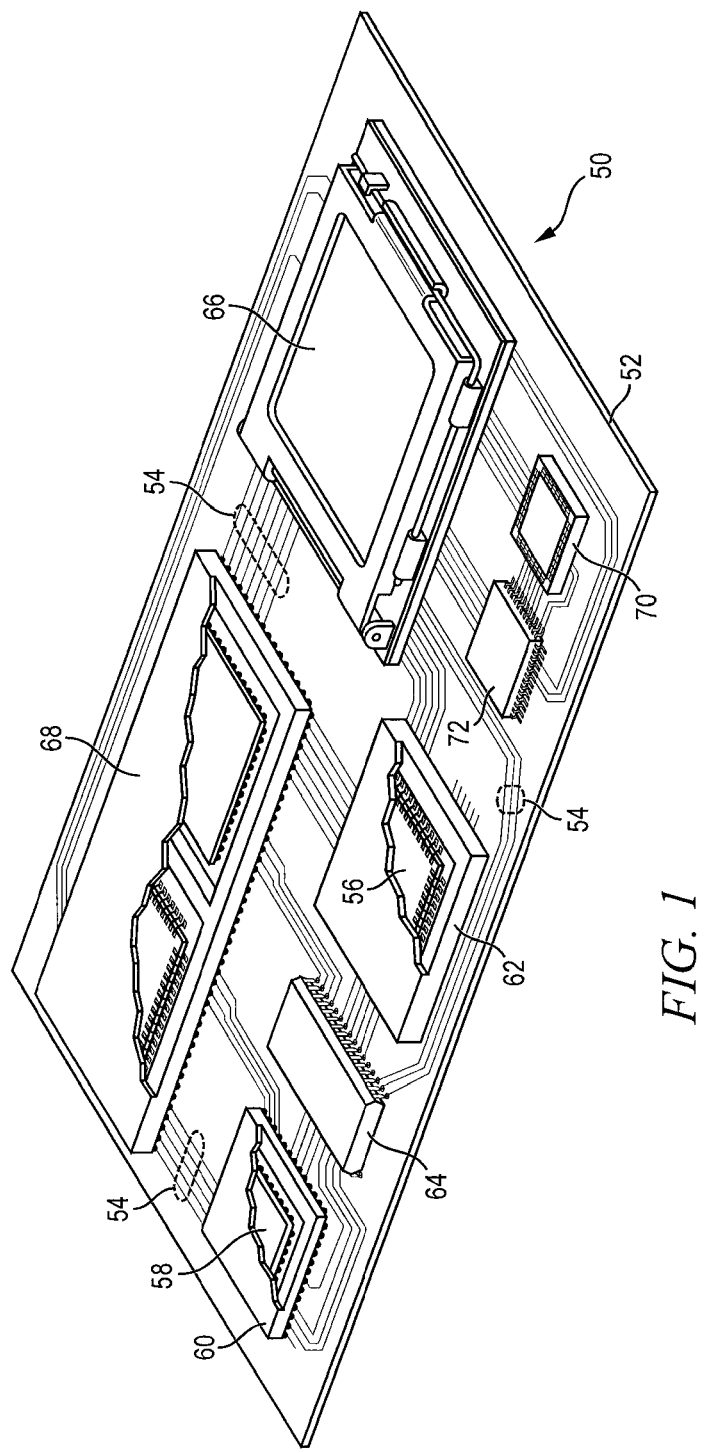
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
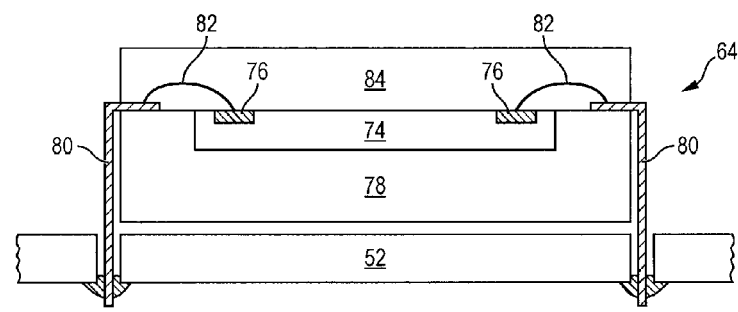
FIGS. 2a-2c illustrate further detail of the representative semiconductor packages mounted to the PCB.
Figure 2B:
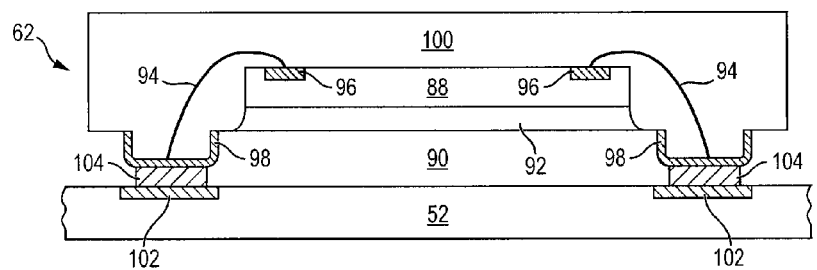
Figure 2C:
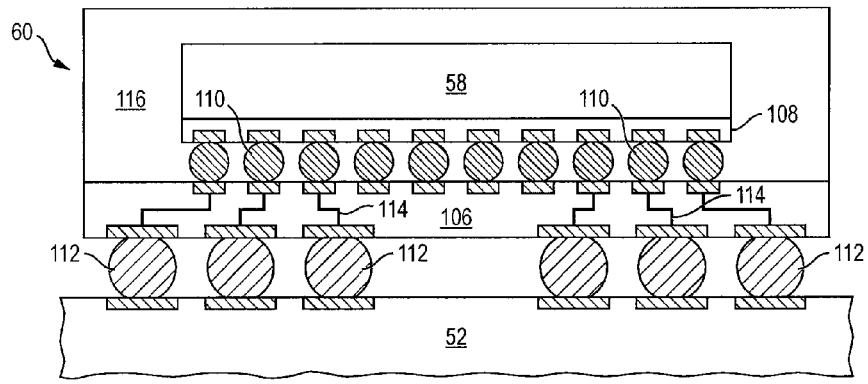

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
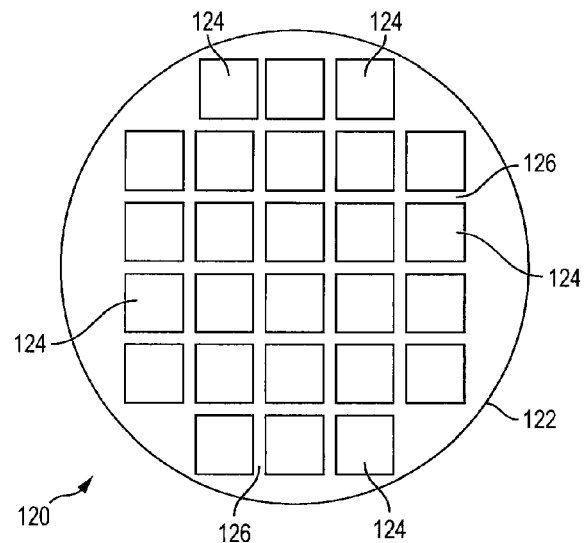
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
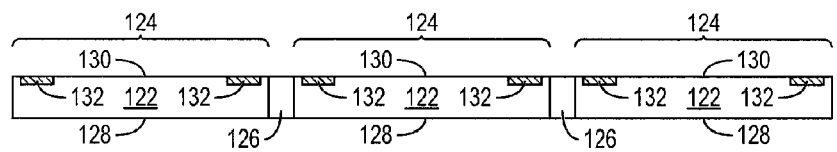

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, baseband SoC, RF transceiver, GSP, PMIC, CMOS power amplifier, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 3C:
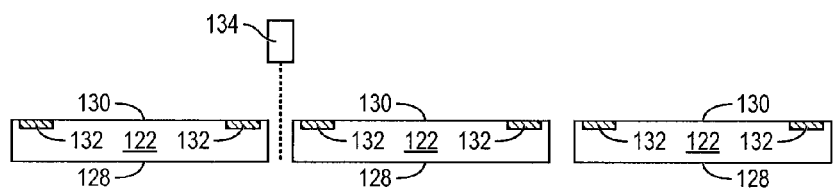

In FIG. 3c, semiconductor wafer 120 is singulated through saw street 126 using a saw blade or laser cutting tool 134 into individual semiconductor die 124.

Figure 4A:
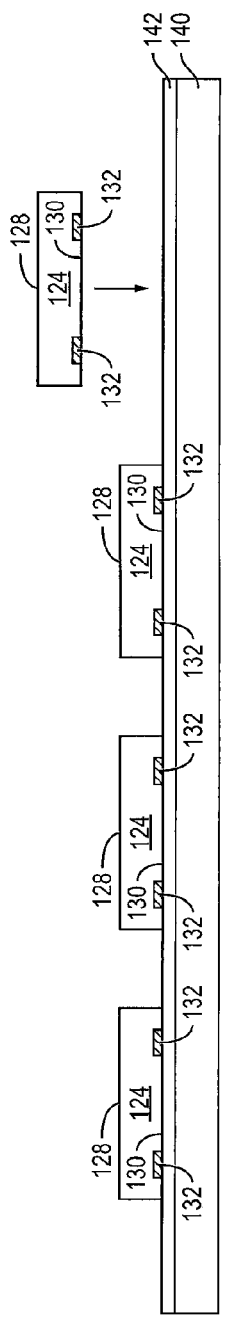
FIGS. 4a-4n illustrate a process of forming openings through an encapsulant of a reconfigured wafer to reduce warpage and stress on a semiconductor package.

FIGS. 4a-4n shows, in relation to FIGS. 1 and 2a-2c, a process of forming openings through an encapsulant of a reconfigured wafer to reduce warpage and stress on a semiconductor package. In FIG. 4a, a substrate or carrier 140 contains temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer.

Figure 4B:
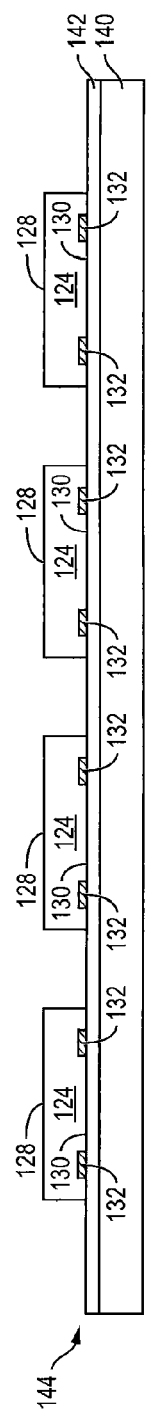

Semiconductor die 124 from FIGS. 3a-3c are positioned over and mounted to interface layer 142 using a pick and place operation with active surface 130 oriented toward carrier 140. FIG. 4b shows all semiconductor die 124 mounted to interface layer 142 over carrier 140 as reconfigured wafer 144.

Figure 4C:
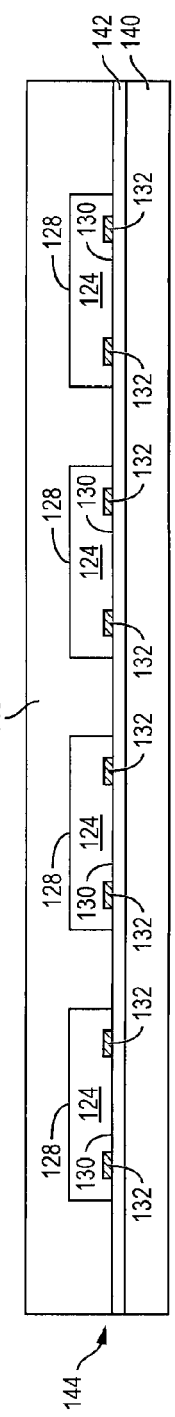

In FIG. 4c, an encapsulant or molding compound 146 is deposited over semiconductor die 124 and carrier 140 using a paste printing, compressive molding, transfer molding, liquid encapsulant molding, vacuum lamination, spin coating, or other suitable applicator. Encapsulant 146 can be polymer composite material, such as epoxy resin with filler, epoxy acrylate with filler, or polymer with proper filler. Encapsulant 146 is non-conductive and environmentally protects the semiconductor device from external elements and contaminants.

Figure 4D:
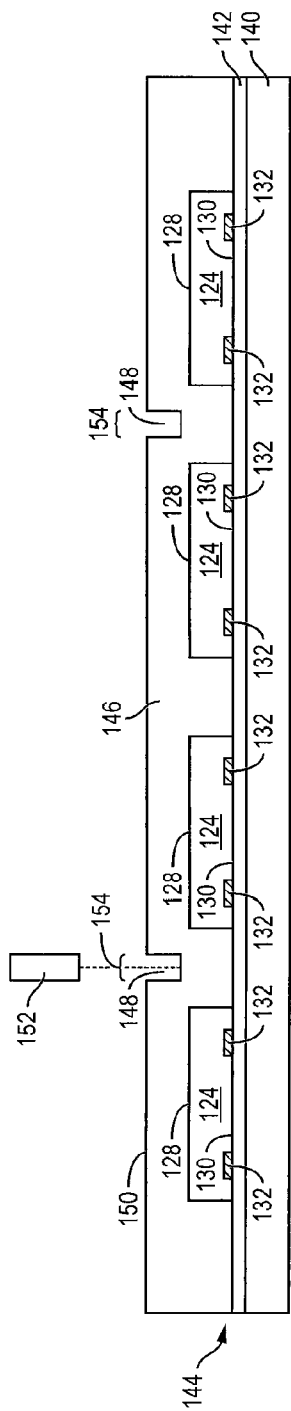
Figure 4E:
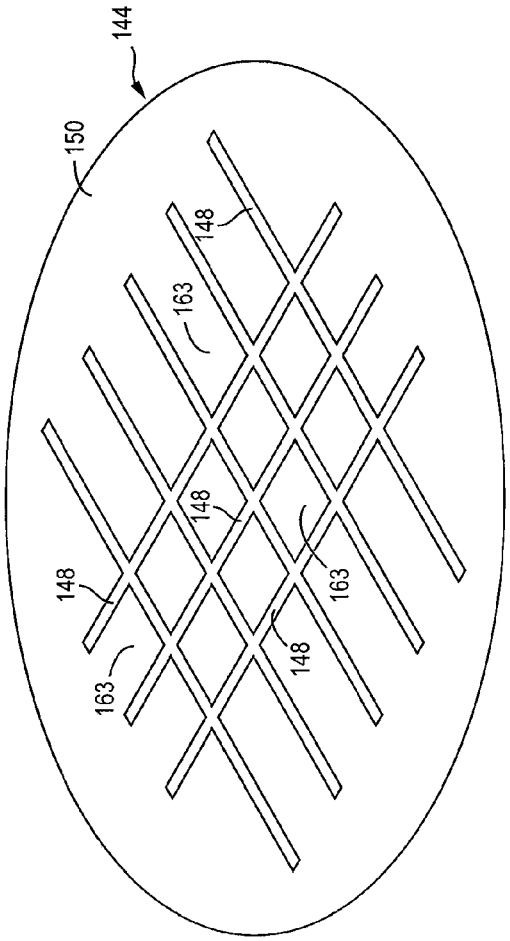
Figure 4F:
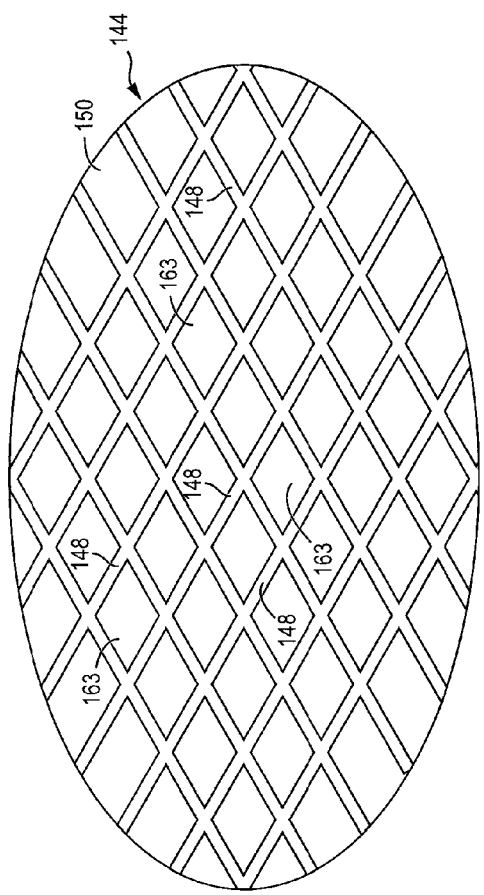

In FIG. 4d, a plurality of openings or channels 148 is cut partially into surface 150 of encapsulant 146, opposite carrier 140, using a saw blade or laser cutting tool 152. In another embodiment, channels 148 are formed by an etching process. Channels 148 coincide with area 154 between semiconductor die 124 with a depth less than the thickness of encapsulant 146 over the semiconductor die. That is, channels 148 terminate before a level of back surface 128 of semiconductor die 124. The sidewalls of channels 148 can be straight or beveled. In one embodiment, channels 148 are formed prior to cure of encapsulant 146. Alternatively, channels 148 are formed post mold cure (PMC). FIG. 4e shows a plan view of channels 148 formed in encapsulant 146 and terminating before the edge of reconfigured wafer 144. FIG. 4f shows a plan view of channels 148 extending to the edge of reconfigured wafer 144.

Figure 4G:
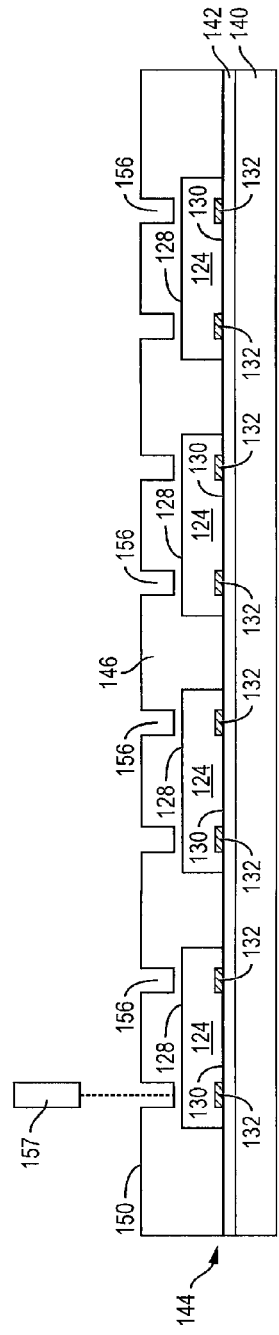

In another embodiment, a plurality of openings or channels 156 is cut partially into surface 150 of encapsulant 146, opposite carrier 140, using a saw blade or laser cutting tool 157, as shown in FIG. 4g. Channels 156 can also be formed by an etching process. In this case, channels 156 are formed over back surface 128 of semiconductor die 124 with a depth less than the thickness of encapsulant 146 over the semiconductor die. That is, channels 156 terminate before reaching back surface 128 of semiconductor die 124. The sidewalls of channels 156 can be straight or beveled. In one embodiment, channels 156 are formed prior to cure of encapsulant 146. Alternatively, channels 156 are formed PMC.

Figure 4H:
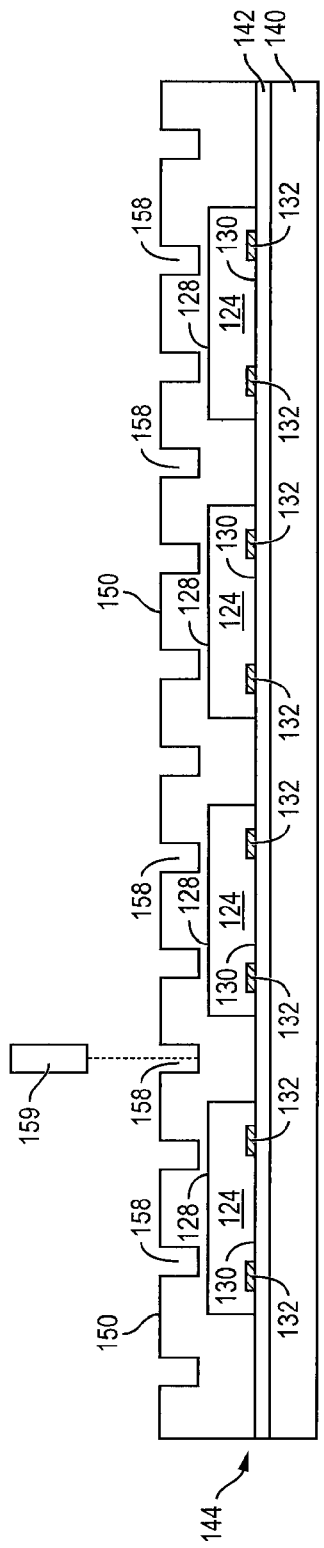

In another embodiment, a plurality of openings or channels 158 is cut partially into surface 150 of encapsulant 146, opposite carrier 140, using a saw blade or laser cutting tool 159, as shown in FIG. 4h. Channels 158 can also be formed by an etching process. In this case, channels 158 coincide with the area between semiconductor die 124, as well as the area over back surface 128 of semiconductor die 124, and have a depth less than the thickness of encapsulant 146 over the semiconductor die. That is, channels 158 terminate before reaching back surface 128 of semiconductor die 124 or before a level of back surface 128 of semiconductor die 124. The sidewalls of channels 156 can be straight or beveled. In one embodiment, channels 158 are formed prior to cure of encapsulant 146. Alternatively, channels 158 are formed PMC.

Figure 4I:
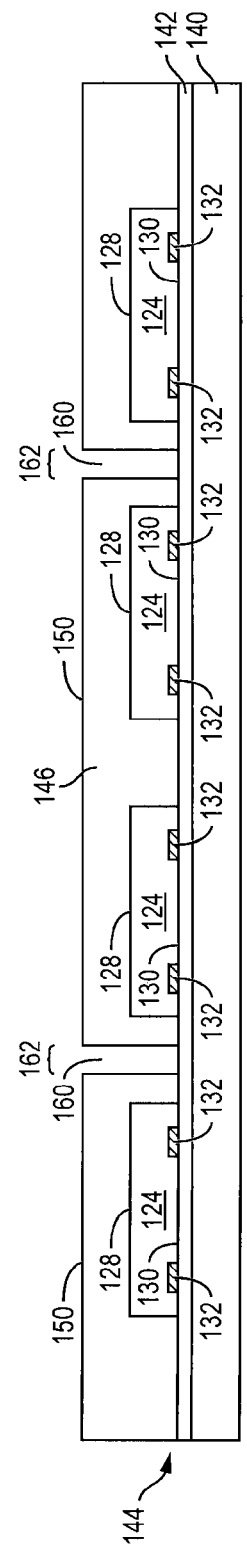

In another embodiment, a plurality of openings or vias 160 is cut into surface 150 of encapsulant 146, opposite carrier 140, using a mechanical drilling, laser drilling, or deep reactive ion etching (DRIE), as shown in FIG. 4i. In this case, vias 160 coincide with area 162 between semiconductor die 124 and extend completely through encapsulant 146 to carrier 140. The sidewalls of vias 160 can be straight or beveled. In one embodiment, vias 160 are formed prior to cure of encapsulant 146. Alternatively, vias 160 are formed PMC. FIG. 4j shows a plan view of vias 160 formed in encapsulant 146.

Channels 148, 156, 158, and vias 160 represent discontinuities in encapsulant 146. The discontinuities in encapsulant 146 divide reconfigured wafer 144 into a plurality of discontinuous segments or regions 163, see FIGS. 4e and 4f. The discontinuous segments 163 reduce warpage of reconfigured wafer 144 because the internal bonds, as well as internal stresses, within encapsulant 146 are broken or negated by the discontinuities. Channels 148, 156, 158, and vias 160 reduce stress within encapsulant 146 thus reducing warpage of reconfigured wafer 144 for subsequent manufacturing steps.

In FIG. 4k, carrier 140 and interface layer 142 are removed by chemical etching, mechanical peeling, CMP, mechanical grinding, thermal bake, UV light, laser scanning, or wet stripping to expose active surface 130 of semiconductor die 124.

A build-up interconnect structure 164 is formed over active surface 130 of semiconductor die 124. The build-up interconnect structure 164 includes an electrically conductive layer or redistribution layer (RDL) 166 formed using a patterning and metal deposition process such as sputtering, electrolytic plating, and electroless plating. Conductive layer 166 can be one or more layers of Al, Cu, Sn, Ni, Au, Ag, or other suitable electrically conductive material. One portion of conductive layer 166 is electrically connected to contact pads 132 of semiconductor die 124. Other portions of conductive layer 166 can be electrically common or electrically isolated depending on the design and function of semiconductor die 124.

The build-up interconnect structure 164 further includes an insulating or passivation layer 168 formed around conductive layers 166 for electrical isolation. The insulating layer 168 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 168 is formed using PVD, CVD, printing, spin coating, spray coating, sintering or thermal oxidation. A portion of insulating layer 168 is removed by an etching process to expose conductive layer 166.

In FIG. 4l, surface 150 of encapsulant 146 undergoes a grinding operation with grinder 170 to planarize the surface and reduce thickness of the encapsulant. The grinding operation removes encapsulant material down to the bottom of channels 148. A chemical etch can also be used to remove and planarize encapsulant 146. In one embodiment, the combination of semiconductor die 124, encapsulant 146, and build-up interconnect structure 164 has a thickness of 50-700 micrometers (μm) after the grinding operation and chemical etching process. FIG. 4m shows encapsulant 146 removed to expose back surface 128 of semiconductor die 124.

In FIG. 4n, an electrically conductive bump material is deposited over build-up interconnect structure 164 and electrically connected to the exposed conductive layer 166 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 166 using a suitable attachment or bonding process. In one embodiment, the bump material is reflowed by heating the material above its melting point to form spherical balls or bumps 174. In some applications, bumps 174 are reflowed a second time to improve electrical contact to conductive layer 166. The bumps can also be compression bonded to conductive layer 166. Bumps 174 represent one type of interconnect structure that can be formed over conductive layer 166. The interconnect structure can also use bond wires, stud bump, micro bump, or other electrical interconnect.

Semiconductor die 124 are singulated with saw blade or laser cutting tool 176 into individual embedded wafer-level ball grid array (eWLB) or Fo-WLCSP 178. FIG. 5 shows eWLB 178 after singulation. Semiconductor die 124 is electrically connected to build-up interconnect structure 164 and bumps 174. While in reconfigured wafer form, eWLB 178 has a plurality of channels 148, 156, 158, and vias 160 formed through encapsulant 146. Channels 148, 156, 158, and via 160 represent discontinuities in encapsulant 146. The discontinuities in encapsulant 146 divide reconfigured wafer 144 into a plurality of discontinuous segments or regions 163. The discontinuous segments 163 reduce warpage of reconfigured wafer 144 because the internal bonds, as well as internal stresses, within encapsulant 146 are broken or negated by the discontinuities. Channels 148, 156, 158, and vias 160 reduce stress within encapsulant 146 thus reducing warpage of reconfigured wafer 144 for subsequent manufacturing steps.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a carrier;
   disposing a plurality of semiconductor dies over the carrier;
   depositing an encapsulant over the semiconductor dies and carrier, wherein a surface of the encapsulant is coplanar with an active surface of the semiconductor dies;
   forming a plurality of openings through a surface of the encapsulant partially through a thickness of the encapsulant to divide the encapsulant into discontinuous segments;
   removing the carrier; and
   forming an interconnect structure over the encapsulant and semiconductor dies with the semiconductor dies embedded between the encapsulant and interconnect structure.

2. The method of claim 1, further including forming the plurality of openings partially through the surface of the encapsulant in an area between the semiconductor dies.

3. The method of claim 1, further including forming the plurality of openings partially through the surface of the encapsulant over the semiconductor dies.

4. The method of claim 1, further including removing a portion of the surface of the encapsulant.

5. The method of claim 1, further including forming the plurality of openings through the encapsulant in an area between the semiconductor dies.

6. The method of claim 1, further including forming the plurality of openings with straight or beveled sidewalls.

7. The method of claim 1, further including curing the encapsulant after forming the plurality of openings.

8. A semiconductor device, comprising:
   a plurality of semiconductor dies disposed side-by-side;
   an encapsulant deposited over and between the semiconductor dies, wherein a surface of the encapsulant is coplanar with an active surface of the semiconductor dies;
   a plurality of openings formed through a surface of the encapsulant partially through a thickness of the encapsulant over an area between the semiconductor dies and over a surface of the semiconductor dies to divide the encapsulant into discontinuous segments; and
   an interconnect structure formed over the encapsulant and semiconductor dies with the semiconductor dies embedded between the encapsulant and interconnect structure.

9. The semiconductor device of claim 8, wherein the plurality of openings breaks internal bonds within the encapsulant.

10. The semiconductor device of claim 8, wherein the plurality of openings includes straight or beveled sidewalls.

11. A semiconductor device, comprising:
    a semiconductor die; and
    an encapsulant deposited over first and second surfaces of the semiconductor die including a plurality of openings formed in a surface of the encapsulant around the semiconductor die to reduce stress within the encapsulant, wherein a surface of the encapsulant is coplanar with an active surface of the semiconductor die.

12. The semiconductor device of claim 11, wherein the openings are formed partially through a thickness of the encapsulant.

13. The semiconductor device of claim 11, wherein the openings extend over the semiconductor die.

14. The semiconductor device of claim 11, further including an interconnect structure formed over the encapsulant and semiconductor die opposite the openings.

15. The semiconductor device of claim 11, wherein the openings include channels extending across the surface of the encapsulant.

16. The semiconductor device of claim 11, wherein the openings divide the encapsulant into discontinuous segments.

17. The semiconductor device of claim 11, wherein the plurality of openings includes straight or beveled sidewalls.

18. A semiconductor device, comprising:
    a semiconductor die; and
    an encapsulant deposited over first and second surfaces of the semiconductor die, wherein a plurality of channels is formed through a surface of the encapsulant partially through a thickness of the encapsulant overlying an area around the semiconductor die and overlying a surface of the semiconductor die to divide the encapsulant into discontinuous segments.

19. The semiconductor device of claim 18, further including an interconnect structure formed over the encapsulant and a third surface of the semiconductor die.

20. The semiconductor device of claim 18, wherein the plurality of channels includes straight or beveled sidewalls.

21. The semiconductor device of claim 18, wherein a surface of the encapsulant is coplanar with an active surface of the semiconductor die.

* * * * *